US010146132B2

(12) United States Patent
Mahapatra et al.

(10) Patent No.: US 10,146,132 B2
(45) Date of Patent: Dec. 4, 2018

(54) MOBILE DISPENSE DEVICE FOR CHEMICALS USED IN MICRO-PROCESSING

(71) Applicant: GLOBALFOUNDRIES Inc., Grand Cayman (KY)

(72) Inventors: Sidheswara Mahapatra, Dresden (DE); Wolfram Grundke, Dresden (DE); Heiko Wagner, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/405,448

(22) Filed: Jan. 13, 2017

(65) Prior Publication Data

US 2018/0203359 A1 Jul. 19, 2018

(51) Int. Cl.
*G03B 27/42* (2006.01)
*G03F 7/20* (2006.01)
*H01L 21/67* (2006.01)

(52) U.S. Cl.
CPC ...... *G03F 7/2041* (2013.01); *H01L 21/67225* (2013.01)

(58) Field of Classification Search
CPC .......... G03F 7/162; G03F 7/3021; G03F 7/16; G03F 7/422; G03F 1/00; G03F 7/167; H01L 21/6708; H01L 21/6715; H01L 21/67051; H01L 21/67253; H01L 21/02282; H01L 21/0276; H01L 21/288; H01L 21/67017; H01L 21/0273; H01L 21/31111; B05B 7/2443
See application file for complete search history.

(56) References Cited

U.S. PATENT DOCUMENTS

| | | | |
|---|---|---|---|
| 5,801,951 A | 9/1998 | Burns, II et al. | |
| 5,916,245 A | 6/1999 | Tom | |
| 6,132,492 A | 10/2000 | Hultquist et al. | |
| 6,204,180 B1 | 3/2001 | Tom et al. | |
| 7,292,914 B2 | 11/2007 | Jungmann et al. | |
| 2007/0272327 A1* | 11/2007 | Lin | G03F 7/162 141/286 |
| 2009/0314798 A1* | 12/2009 | Hovinen | B01J 4/02 222/23 |
| 2010/0004772 A1 | 1/2010 | Elfstrom et al. | |
| 2012/0111374 A1* | 5/2012 | Despres | H01J 37/02 134/34 |

\* cited by examiner

*Primary Examiner* — Mesfin Asfaw
(74) *Attorney, Agent, or Firm* — Amerson Law Firm, PLLC (57) ABSTRACT

The present disclosure relates to techniques for supplying different chemical products to process tools of a manufacturing environment used for micro-processing substrates. To this end, the various types of chemical products may be supplied by providing mobile dispense devices having incorporated therein any required hardware components for dispensing a chemical product. Moreover, the mobile dispense devices are appropriately equipped so as to enable coupling to and removal from respective process tools, such as wafer tracks of modern lithography tools. Due to the mobile or modular nature of the respective chemical product lines, a significant reduction of cost of ownership, increased tool availability and reduced investment costs may be achieved compared to conventional regimes.

17 Claims, 5 Drawing Sheets

MOBILE DISPENSE DEVICE FOR CHEMICALS USED IN MICRO-PROCESSING

BACKGROUND OF THE INVENTION

1. Field of the Invention

Generally, the present disclosure relates to the field of micro-processing, i.e., to the field of processing workpieces, such as substrates, wafers and the like, so as to form therein or thereon structures having features of dimensions in the micrometer range and below. For instance, micro-processing is required for forming semiconductor devices in the form of integrated circuits, micro-mechanical devices, micro-optical devices and the like, wherein, typically, a plurality of process tools, such as lithography tools and the like, have to be used in combination with appropriate consumables in order to establish required conditions and material layers on substrates for forming the device patterns.

2. Description of the Related Art

In the field of manufacturing products including structures of dimensions of several hundred micrometers and significantly less, wherein a critical dimension, i.e., a minimum structure size to be reliably and repeatedly formed in the structures under consideration, typically, a plurality of highly interrelated processes have to be applied in order to finally arrive at the desired product. One prominent technical field in this respect is the fabrication of micro-electronic devices, micro-optical devices, micro-mechanical devices and the like, in which typically a respective complex sequence of individual process steps has to be applied, starting from the appropriate raw material, such as a semiconductor wafer, to finally arrive at packaged semiconductor devices. For example, one basic type of processing in this field of technology is the transfer of a specific device pattern onto or in a specific material layer provided on the substrate material. To this end, typically, optical transfer techniques, such as photolithography, may be used, while, in other cases, in addition or alternatively, a specific device pattern may be formed by mechanical contact of a patterned die with a deformable material formed on the substrate. After curing, the device pattern may itself act as a mask for patterning any other underlying material layers or any layers still to be formed above the patterned layer.

Other processes involve the incorporation of dopant species by implantation techniques, which typically require the formation of an appropriate mask material so as to specifically position the dopant species in well-defined locations of the one or more material layers formed on the substrate material. Furthermore, an important factor for contributing to the significant advances of modern micro-processed products has been the implementation of highly anisotropic patterning techniques, such as plasma-based etch technologies and the like, which enable the transfer of a device pattern formed in a removable material into underlying permanent material layers with high precision.

Typically, many of these processes are associated with the application of specific chemical products, such as photoresist materials of different types, developing agents, etch chemicals, when a substantially wet-chemical etch process has to be applied, cleaning agents, and the like, wherein the number of processes in which such chemical products have to be applied and the variety of chemical products to be used have significantly increased with the ongoing tendency for forming even more complex and complicated products. For example, when forming sophisticated semiconductor devices, a plurality of different types of lithography processes have to be implemented into the entire process sequence so as to appropriately pattern the various device layers on the basis of one or more removable resist materials. Due to the ever increasing demands imposed on the pattern transfer techniques, the lithography itself has evolved into a very complex process sequence requiring a plurality of process steps, at least some of which may involve the application of process fluids of different types, depending on the specific requirements of the lithography process under consideration.

By way of example, frequently, when applying a photoresist material, which represents one type of chemical product to be used in a photolithography sequence, a solvent may be applied so as to appropriately wet the surface and prepare the surface conditions for the subsequent deposition of the actual resist material. Typically, the respective solvent has to be selected on the basis of the characteristics of the resist material so that different types of solvent products may have to be used, depending on the specific resist material to be applied. Moreover, in sophisticated applications, frequently a bottom anti-reflective coating may have to be formed prior to the deposition of the actual resist material in order to enhance the overall optical characteristics, for instance, by leveling the surface topography of a patterned surface and/or by adjusting reflectivity and/or absorption for the radiation used during the actual exposure process. In still other cases, a further material may be applied on top of the resist material in order to enhance the total optical characteristics and/or provide for specific surface conditions by providing this top coating prior to the further processing, for instance prior to a thermal treatment, also referred to as baking, for resulting layer stack, followed by the actual exposure process.

After one or more exposure processes, depending on the complexity and the critical dimension of the device pattern to be transferred, further process steps, such as a thermal treatment after exposure, and in particular developing the previously exposed material layers, have to be performed, which may also typically require the application of one or more appropriate developer materials. During the development, the desired device pattern formed in the removable material layers is obtained, which in turn may be used for transferring the non-permanent device pattern of the removable material layers into one or more lower lying material layers by sophisticated anisotropic etch techniques. Usually, the resulting non-permanent device pattern may be subjected to inspection processes in order to determine any outliers, which may have to be reprocessed, which typically requires the removal of the preceding non-permanent material layers on the basis of appropriate removal techniques. Also in this case, the application of one or more chemical products may be required for removing and cleaning the involved products.

Furthermore, frequently, an associated sequence of related processes may typically be started and ended with an appropriate cleaning process, which may be performed on the basis of specific cleaning agents in order to prepare the substrates for the further processing, transport and the like. Moreover, in a complex manufacturing environment, such as a semiconductor facility producing different types of semiconductor devices, a plurality of process tools of a specific type is concurrently in use, wherein, however, different process recipes may have to be implemented so as to conform to the requirements of the various different types of products to be produced. That is, when considering the complex sequence of processes related to performing a lithography process, different process recipes may have to be performed for the same product at different process stages. For instance, when transferring a device pattern used for forming sophisticated device elements, such as gate electrode structures and the like, there is usually required a highly sophisticated recipe based on specific chemical products, while in other cases less sophisticated process conditions may suffice in order to transfer the respective pattern to the semiconductor devices, for instance, when performing implantation processes in order to appropriately position dopant species in specific device areas. Moreover, depending on the frequency of specific process recipes to be applied, the respective number of process tools having implemented therein the respective process recipes may be adjusted accordingly. For instance, one or only a small number of process tools may be equipped with specific chemical products in accordance with process recipes that are used with low frequency, while a significantly higher number of process tools may be necessary for meeting the requirements for other types of processes, such as implantation processes, which may have to be frequently applied during an entire manufacturing sequence for forming a complex semiconductor device.

As a consequence, in many interrelated process sequences, a plurality of different chemical products have to be applied, wherein the number and the specific type of chemical product frequently depends on the specifics of the various process recipes to be implemented by the basic process sequence under consideration. That is, a lithography tool in combination with the corresponding process tools used for the other interrelated process steps, as explained above, may be configured to implement a plurality of different process recipes, thereby requiring the associated process tools to perform the interrelated processes on the basis of the appropriate chemical products. Therefore, typically, each of the process tools for performing the process steps associated with the respective lithography recipe may have to be configured to provide the different types of specific chemical products at any time, thereby involving a high degree of complexity with respect to storing different chemical products and installing respective hardware components for applying these different chemical products.

In sophisticated manufacturing environments, respective complex process sequences may be performed on the basis of so-called cluster tools, which represent a complex structure of process tools and modules, which may share certain hardware components, such as a substrate handling unit and the like, in order to enhance overall tool efficiency by, for instance, avoiding additional transport steps and the like. For example, lithography tools typically represent a part of a cluster tool, which may also comprise a so-called wafer track, which may represent a combination of tools or modules for performing different process steps, such as applying a bottom anti-reflective coating, applying resist material, applying a top coating on top of the resist material and the like. To this end, the part of the cluster tool including process tool modules for the additional process steps as described above may be appropriately equipped with a process chamber, for instance a coating cup, for receiving the substrate and applying thereon any solvents and process fluids required for forming a resist material. Depending on the overall complexity, two or more coating cups may be provided so as to enable the processing of two or more substrates concurrently on the basis of the same chemical products and/or enabling the processing of substrates at different stages of the overall process sequence. Therefore, a respective wafer track or process tool is equipped with hardware components, such as pumps, valves, filters and, in particular, respective storage containers for the chemical products to be used in the context of the various process recipes, which the cluster tool including the process tool and the lithography tool has to apply. In order to increase overall flexibility within the manufacturing environment, it is typically necessary to set up the respective cluster tools so as to be able to perform a plurality of different process recipes, thereby requiring the various process tool modules to be configured so as to allow the provision of the different types of chemical products at any time. Although this concept may significantly increase the flexibility in scheduling the overall workflow in the manufacturing environment, there are also significant disadvantages involved in this concept. For example, the hardware components and the storage container for each respective chemical product has to be kept in a functional state, which typically requires a regular "dummy" deposition of a respective chemical product, thereby resulting in a significant consumption of chemical products without actually using the chemical product in a process step. Assuming a dummy application of approximately 1 centimeter per hour and per non-used chemical product may result in approximately 175 L of wasted product per year, which may significantly contribute to the overall cost of ownership, since typically these chemical products are extremely expensive. Moreover, regular maintenance activities with respect to the hardware components and in particular with respect to keeping a certain minimum fill level in the respective storage container may have to be performed in view of tool availability and reliability. Depending on the number of different chemical products to be entertained in a corresponding cluster tool, the respective maintenance activities may be more or less time-consuming and may also result in a downtime of the entire cluster tool.

Similarly, if a failure in one of the hardware components for a specific type of chemical product is detected, the corresponding involved non-scheduled maintenance may also contribute to additional downtime of the respective cluster tool. Moreover, as discussed above, in view of overall flexibility in scheduling the workflow in the manufacturing environment and with respect to a high degree of availability of a certain process recipe, it may be desirable to equip the various cluster tools with many different types of chemical products, which in turn may provide the capability of performing a plurality of different process recipes within a single cluster tool. On the other hand, the number of chemical products that can be installed in a single cluster tool may be restricted, due to the overall configuration of these tools, thereby imposing a certain degree of restriction with respect to tool availability. Nevertheless, in view of achieving high flexibility and availability of different types of process recipes, the same specific type of chemical product may have to be installed in a plurality of cluster tools. The implementation of the same type of chemical product in different cluster tools may, however, contribute to an increase of the total time during which the chemical product under consideration is actually not in use, thereby increasing the overall waste of this material, for instance due to dummy dispense, as explained above. Moreover, when installing the same type of chemical product in different cluster tools, additional qualification processes may have to be performed in addition to further regular maintenance activities with respect to other hardware components and consumables, such as filters and the like, thereby further increasing the cost of ownership for a specific type of chemical product.

Since basically there is a tendency for concentrating more and more steps of the fabrication of more and more complex micro-processed devices in a single facility, the implementation of a relatively high number of process recipes in a moderately high number of respective process tools, such as cluster tools used for lithography processes, is required. Therefore, the cost of ownership for maintaining a respective high number of chemical products in order to provide a desired degree of flexibility in scheduling the overall workflow and obtaining a desired high availability for each type of process recipe may represent a significant factor of the overall costs of complex micro-processed products.

In view of the situation described above, the present disclosure, therefore, relates to techniques in which overall efficiency of the micro-processing of respective products may be enhanced, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Basically, the present disclosure is based on the concept that supply of process recipe related process fluids and, in particular, the operation of dispensing these process fluids may be "decoupled" from the respective process tool, thereby enhancing overall performance of a manufacturing environment for micro-processing by reducing tool downtime and/or process fluid consumption.

In one illustrative embodiment of the present disclosure, a mobile dispense device is provided. The mobile dispense device includes a storage container for a chemical product and a dispense unit coupled to the storage container, wherein the dispense unit comprises a pump unit, a filter unit, a valve unit and a dispense nozzle. Furthermore, the mobile dispense device includes a coupling unit configured to enable the mobile dispense unit to be coupled to and removed from a process tool used for micro-processing. Moreover, the mobile dispense device includes a control unit operatively connected to at least the dispense unit and configured to control at least one of the pump unit and the valve unit.

According to a further illustrative embodiment of the present disclosure, a system is provided that includes a process tool and a plurality of mobile dispense devices. The process tool includes a substrate handling portion that is configured to receive and process one or more of the substrates. The process tool further includes a coupling portion. Each of the mobile dispense devices includes a storage container for a chemical product, a dispense unit coupled to the storage container and a coupling unit configured to enable the mobile dispense device to be coupled to and removed from the coupling portion. Moreover, each of the mobile dispense devices is configured to be coupled to the process tool on demand.

According to a still further illustrative embodiment of the present disclosure, a method of operating a process tool for micro-processing substrates in a manufacturing environment is provided. The method includes determining a specific type of chemical product to be applied to the substrates when processing the substrates in the process tool. Moreover, the method includes selecting, from a plurality of mobile dispense devices, wherein each one is configured to provide one of a plurality of specific chemical products, one mobile dispense device that is configured to provide the specific type of chemical product. Additionally, the method includes coupling the selected mobile dispense device to the process tool.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure is generally based on the concept that the handling of chemical products in a manufacturing environment may be significantly enhanced by providing additional "modularity" in the context of supplying various types of chemical products to various process tools. That is, according to the present disclosure, it has been recognized that providing a specific type of chemical product and the respective hardware components required for dispensing the chemical product may be efficiently separated from the hardware components used in a process tool for receiving and handling substrates. The mobile or modular nature of a corresponding dispense device for chemical products enables, in combination with appropriate hardware connectivity at the tool side, to supply one or more chemical products on demand for a specific process tool, thereby providing the ability of specifically adapting the chemical infrastructure of a specific manufacturing environment to the corresponding process recipes to be handled in the manufacturing environment and in the process tools.

That is, a specific degree of flexibility in scheduling the overall workflow in a manufacturing environment is traditionally achieved by permanently equipping respective process tools with a moderately high number of chemical products and their respective dispense hardware components, depending on the available hardware resources of the process tool under consideration, thereby contributing to significant cost of ownership due to material waste, increased downtime of process tools and the like, as discussed above. By implementing the concept of a mobile dispense device according to illustrative embodiments of the present disclosure, however, the number of devices for dispensing chemical products connected to a specific process tool may be significantly reduced, thereby also reducing the number of any idle dispense units that may conventionally contribute to significant material waste and increased downtime of process tools.

In illustrative embodiments disclosed herein, the process tool may represent a wafer track system associated with lithography tools, i.e., a process tool comprising one or more modules for performing respective process steps prior to and/or in between and/or after an actual exposure process so as to condition the substrate under consideration for the exposure process, for instance, by applying respective material layers in the form of substantially fluid chemicals and the like. In this respect, a process tool according to the present disclosure may be understood as an entity that requires at least one chemical product to be supplied thereto in order to perform one or more processes, such as processes associated with the lithographic exposure of substrates, which may undergo a micro-processing, i.e., a processing, during which device patterns with critical dimensions on the order of micrometers and significantly less may be formed.

Due to the mobile nature of the dispense device according to illustrative embodiments, a chemical product may be readily supplied sequentially to different process tools, thereby reducing the number of concurrently used chemical "lines" for one and the same chemical product. For example, if one process tool is operated in accordance with a specific process recipe, thereby requiring the application of a specific type of chemical product, and subsequently the same process tool may be used for implementing a different process recipe, which no longer requires the specific type of chemical product, the mobile dispense device may be removed from the process tool under consideration and may be coupled to a different process tool, which may, at this stage of the overall workflow, require the specific type of chemical product. In other cases, an idle time of a specific mobile dispense device may be used for performing maintenance of hardware components related to dispense of the chemical product, refilling a substantially exhausted storage container and the like, thereby also avoiding unnecessary downtime of a specific process tool. Hence, in illustrative embodiments, the mobile dispense devices represent fully autonomous entities, at least with respect to containment of chemicals and dispense of chemicals, which may move or be transported to a respective process tool on demand, thereby providing a system on demand in a manufacturing environment including one or more process tools and a plurality of mobile dispense devices that cover, in some embodiments, at least a certain range of process recipe related process fluids, and, in particular embodiments, cover the entire range of required process recipe related process fluids.

Since generally the number of concurrently used mobile dispense devices may be reduced compared to a situation wherein a plurality of chemical products may be installed in a substantially permanent manner in a plurality of process tools in view of overall processing flexibility, the overall costs of running a respective process sequence, such as a lithography process, in a complex manufacturing environment may be significantly reduced, while at the same time improving the overall manufacturing flexibility.

Figure 1A:
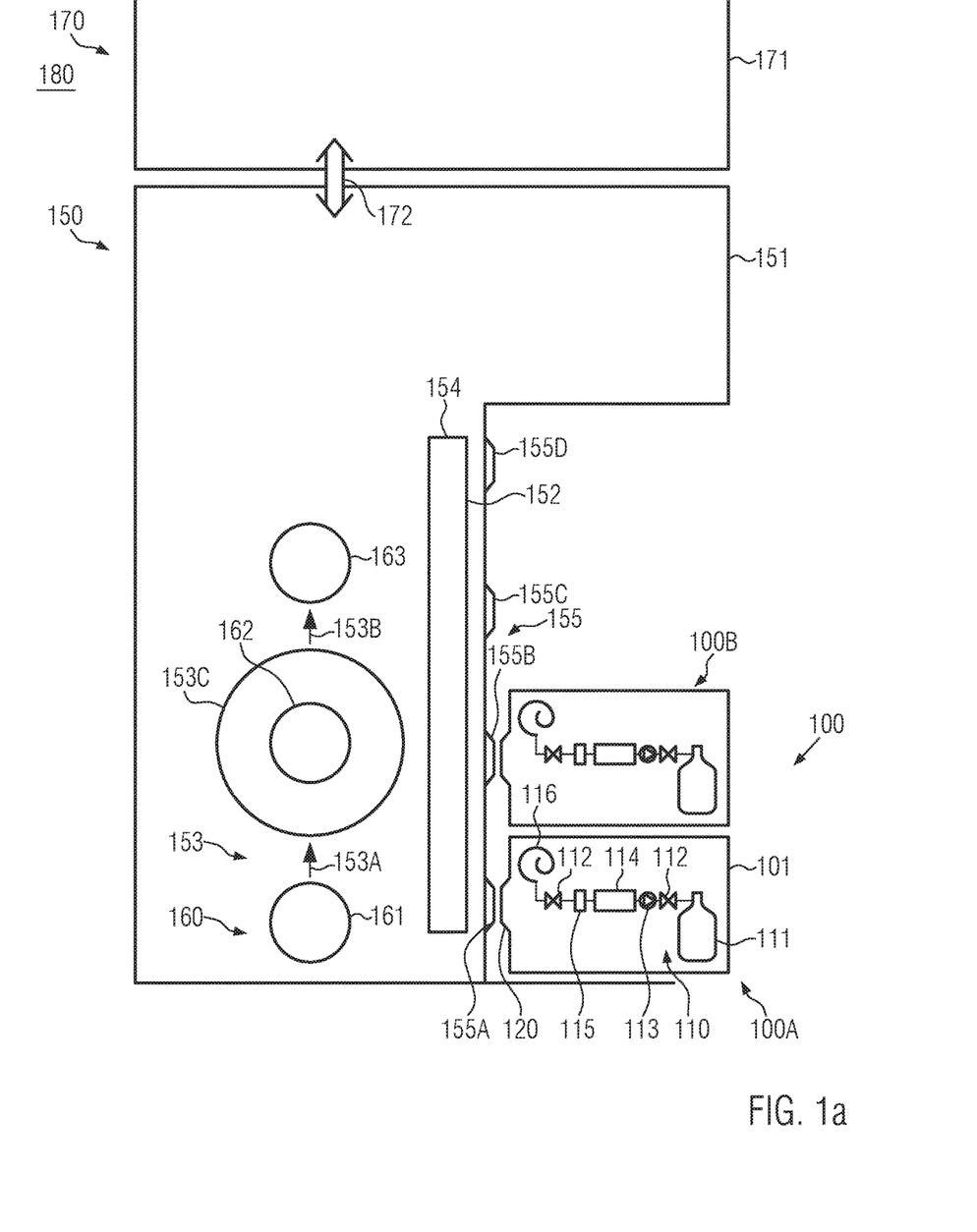
FIG. 1a schematically illustrates in a simplified manner a process tool, which may functionally be associated with another process tool, such as a lithography tool, thereby forming a cluster tool, to which one or more mobile dispense devices may be coupled according to illustrative embodiments.

FIG. 1a schematically illustrates a process tool 150, which may represent any appropriate process tool for microprocessing substrates 160, such as semiconductor wafers, or any appropriate other carrier materials in and/or above which respective device structures may be formed on the basis of process techniques involving the patterning of respective material layers so as to obtain device patterns having at least some features with critical dimensions in the range of several hundred micrometers to several nanometers, for instance, when performing sophisticated semiconductor devices in the form of integrated circuits and the like. The process tool 150 may typically comprise an appropriate mainframe 151, which houses any hardware components required for exchanging the substrates 160 with a manufacturing environment 180, such as a semiconductor facility or a respective portion thereof. For example, although not shown in FIG. 1a, appropriate substrate loading and unloading areas may typically be provided at certain locations within the mainframe 151 so as to receive the substrates that need to be processed in the process tool 150 and to store substrates already processed in the process tool 150 or any other process tool functionally associated with the process tool 150.

It should be appreciated, although not necessary for implementing the concept of the present disclosure, that an automated transport system (not shown) may typically be used for exchanging the substrates 160 between the process tool 150 and the environment 180. Moreover, the process tool 150 may comprise a substrate handling portion 153, which may include any required components for handling and processing the substrates 160 within the process tool 150. In FIG. 1a, the substrate handling portion 153 is illustrated in a very simplified and schematic manner, in which it is indicated that the plurality of substrates 160, such as substrates 161, 162, 163, may be stepped through the process tool 150 by appropriate substrate transport and load components, such as any appropriate substrate tracks, substrate robots and the like, indicated by 153A and 153B. That is, the process tool 150 may comprise any hardware components required for receiving the substrates 160, after being transported to the process tool 150, and conveying the respective substrates through one or more process zones, thereby defining a substrate track or wafer track as required for pre-processing and post-processing with respect to another process, such as a lithography process, as will be explained later on in more detail.

For example, in FIG. 1a, the substrate handling portion 153 is illustrated so as to have one process chamber or processing zone 153C, for instance in the form of a coating cup, which is typically configured to receive a substrate therein, such as the substrate 162, and to treat the substrate 162 so as to receive at least one chemical product in the form of a process fluid for forming a specific material layer and/or adjusting surface characteristics for a subsequent deposition of a further chemical product and the like. Consequently, the processing zone 153C may comprise any hardware components, such as a substrate handling component for loading and unloading substrates into and from the processing zone 153C, which may comprise a rotatable substrate chuck, as is typically used for spinning the respective substrate 162 prior to and/or during and/or after dispensing one or more specific types of chemical products.

Furthermore, the process tool 150 may comprise a coupling portion 155, which is appropriately configured so as to removably connect to one or more mobile dispense devices 100. In one embodiment, the process tool 150 is configured such that any process recipe related process fluid, that is, any process fluid required for implementing a specific process recipe and excluding any fluids that are possibly required for the mere mechanical function of the process tool 150 per se, may be supplied by the mobile dispense devices 100. In this case, the process tool 150 does not include any "stationary" components for supplying other process recipe related process fluids.

In the illustrative embodiment shown in FIG. 1a, the coupling portion 155 may comprise a plurality of individual coupling stations 155A, 155B, 155C, 155D, each of which is appropriately configured to connect to a respective one of the mobile dispense devices 100, thereby providing a certain degree of mechanical support and enabling a decoupling of a selected one of the mobile dispense devices 100 for instance by activating/deactivating a lock mechanism (not shown), or any other appropriate component for temporarily establishing a mechanical connection. Furthermore, the individual coupling stations 155A-155D may, in some illustrative embodiments, further provide other functional connections, such as electrical connections and/or fluid connections and the like, if required, for appropriately establishing a functional connection between the process tool 150 and any of the mobile dispense devices 100. It should be appreciated that the coupling portion 155, although including four coupling stations 155A-155D in FIG. 1a, may have any appropriate number of coupling stations as is consistent with the overall configuration of the process tool 150. The number of individual couplers or coupling stations 155A-155D may, for instance, depend on the overall size of the mainframe 151 and may, in particular, depend on the specific configuration with respect to the number of individual process steps implemented in the process tool 150. For example, if the process tool 150 may be configured to provide a certain type of material layer, such as a resist layer, and when, for instance, only three different types of resists may be used in the manufacturing environment 180, possibly in combination with a specific solvent to be applied prior to depositing a respective photoresist material, two or three coupling stations 155A-155D may suffice, since, due to the mobile nature of the dispense devices 100, a required chemical product may be supplied to the process tool 150 on demand and need, therefore, not be permanently installed in the process tool 150, as will also be explained later on in more detail.

It should further be appreciated that the process tool 150 may comprise a plurality of process modules, some of which may be configured in a similar manner as the substrate handling portion 153, thereby allowing the deposition of different chemical products in different processing zones, when considered appropriate with respect to overall throughput and with respect to cross contamination of respective processes. For example, in sophisticated lithography processes, typically a bottom anti-reflective coating may have to be formed prior to depositing the actual resist material, wherein the deposition of the bottom anti-reflective coating may be performed in the same or a different processing zone as the deposition of the actual resist material. Similarly, if a top coating has to be provided on top of the actual resist material, such a material layer may be formed in the same processing zone 153C, which may also be used for depositing the actual resist material, while in other cases a different processing zone may be used. In still other illustrative embodiments (not shown), a plurality of processing zones 153C may be provided, each of which may perform different process steps, thereby also achieving a significantly enhanced overall substrate throughput. Irrespective of the specific configuration of the process tool 150, in some illustrative embodiments, a fluid supply system 154 may be provided, which is appropriately configured so as to establish a fluid path between any one of the mobile dispense devices 100 and a specific location within the one or more processing zones 153C. For example, the system 154 may comprise an automatic handling component for guiding a dispense nozzle 116 of the mobile dispense device 100 to a specific location in the processing zone 153C, thereby enabling a precise output of a specific chemical product at the specified location.

The mobile dispense devices 100 may represent appropriately equipped components, which are to be considered as "mobile" in the sense that these devices are appropriately configured so as to enable transport within the manufacturing environment 180 without undue effort and in that the mobile dispense devices 100 provide a certain degree of functional independence with respect to the dispense of a specific chemical product. That is, in some illustrative embodiments, the mobile dispense devices 100 may represent transportable devices, which are appropriately configured so as to enable the dispensing of a certain type of chemical product without actually being connected to any other component, except for a connection to a power source, while, in other cases, the devices 100 may include a power source (not shown) so as to ensure operability of the device 100 or at least a portion thereof, even if not connected to any external power supply. In some illustrative embodiments, the mobile dispense devices 100 may comprise an appropriate housing 101, which may have a suitable configuration so as to accommodate the required components and to be connectable to the coupling portion 155 of the process tool 150. In some illustrative embodiments, at least the housing 151 may have standardized configuration in order to accommodate any type of chemical product and the associated dispense hardware and to allow connection to any coupling station of the coupling portion 155. In other cases, a different design for different chemical products may be used for the housing 151, if considered appropriate. In any case, the housing 101 may have incorporated therein a dispense unit 110, which, in some illustrative embodiments, may include all necessary hardware components for storing and dispensing one or more chemical products in the form of process fluids. In the illustrative embodiment shown in FIG. 1a, each individual mobile dispense device 100A, 100B may be configured so as to store and provide a single chemical product, such as a specific type of photoresist, a specific type of solvent, a specific type of an anti-reflective coating material used as a bottom anti-reflective coating, a specific type of material used for a top coating or a top anti-reflective coating, and the like. To this end, the dispense unit 110 may comprise a storage container 111, a pump unit 113, a respective set of valves 112, a buffer tank 114, if required, a filter unit 115 and the dispense nozzle 116.

It should be appreciated that any other hardware components, such as respective lines for connecting the various functional components of the dispense unit 110 and the like, may also be provided, which, for convenience, are not illustrated in FIG. 1a. Moreover, each of the mobile dispense devices 100 may comprise electronic components (not shown), such as a control unit, as required for operating the devices in a controlled manner, in particular for controlling the pump unit 113 and/or one or more of the valves 112, wherein, in some illustrative embodiments, as discussed above, the power source may be included in each of the devices 100 so as to temporarily supply energy to the various energy requiring components or at least a portion thereof. In this case, at least a certain degree of functionality can be maintained, even if the respective mobile dispense device 100 is not connected to an external power supply or to a process tool. For example, certain control functions may be maintained irrespective of the supply of external power, thereby providing a certain degree of fail-safe operability.

Furthermore, the mobile dispense devices 100 may comprise a coupling unit 120, which may be appropriately configured so as to allow connection to a respective one of the coupling stations 155A-155D of the coupling portion 155 of the process tool 150. The coupling unit 120 may impart a certain mechanical support upon connecting the mobile dispense device 100 to the process tool 150, thereby ensuring, in combination with the housing 101, a reliable mechanical connection to the process tool 150. Moreover, if required, the coupling unit 120 may also provide electrical connection and/or fluid connection between the process tool 150 and the mobile dispense device 100. For example, electrical connections may be established on the basis of the coupling unit 120 so as to provide energy to the device 100 and/or exchange control data and the like between the device 100 and the process tool 150. In this manner, the status of each of the mobile dispense devices 100 may be readily communicated to a supervising control system of the manufacturing environment 180 or at least to the controller of the process tool. In other cases, the communication with the supervising control system of the environment 180 or the controller of the process tool 150 may be established on the basis of wireless communication, wherein, for example, only a control signal as required for coordinating the operation of the devices 100 and of the respective one or more processing zones 153C of the process tool 150 may be exchanged. For example, the control unit (not shown) within the mobile dispense device 100 may receive a start signal from the process tool 150, thereby initiating the dispensing of the respective chemical product by, for instance, driving the metering pump unit 113 so as to dispense a desired amount of a chemical product. The corresponding "recipe" for appropriately dosing the chemical product may be implemented in advance in the device 100 and/or respective instructions may be sent from the process tool 150 to the mobile dispense device 100. It should be appreciated that respective signals may also be transmitted in a wireless manner from the process tool 150 or a supervising control system to the mobile dispense device 100 in order to appropriately coordinate the various functions, when reliability of wireless communication within the manufacturing environment 180 is not a concern.

Upon operating the process tool 150 in the manufacturing environment 180, it may be determined, for instance, by the supervising control system of the environment 180 or by any other instance which specific process recipe is currently to be used in the process tool 150 and in a functionally associated process tool 170. In some illustrative embodiments the associated process tool 170 may represent a lithography tool for exposing the substrates 160, which may be processed in the tool 150 prior to and/or after being processed in the lithography tool 170. As illustrated, the process tool 170 may comprise an appropriate mainframe 171 appropriately connected to the process tool 150, thereby establishing a functional connection 172, which is to represent any functional connection required for exchanging the substrates between the tools 150 and 170. Thus, the process tools 170 and 150 may form in combination a so-called cluster tool, which comprises the functional connection 172, thereby enhancing overall efficiency by sharing certain components compared to stand-alone entities, which may be operationally connected by an automated transport system.

As already discussed above, the process recipe, for instance the type of exposure to be performed in the lithography tool 170, is determined, among others, by the corresponding technology node, that is, a specific process technology, such as CMOS and the like, in combination with the corresponding critical dimension, by the manufacturing stage of the substrates processed in accordance with the respective technology node and the like. Therefore, the process recipes to be implemented in the lithography tool 170 may also determine the respective "recipes" in the process tool 150, since a specific type of photoresist, a specific type of bottom anti-reflective coating, a specific type of top coating and the like are associated with the actual exposure recipe. Consequently, prior to starting the processing of the substrates 160 that require the implementation of a specific recipe, the corresponding one or more mobile dispense devices 100 are transported and coupled to the process tool 150. In the illustrative embodiment shown in FIG. 1a, the process tool 150 may be operated on the basis of two different chemical products A, B, which may be provided by the mobile dispense devices 100A, 100B, respectively. Since, in some illustrative embodiments, the mobile dispense devices 100 may be fully operational, that is, the devices 100 may be fully autonomous, without being coupled to any process tool, the operational status of the devices may be checked in advance and also the qualification of the corresponding chemical products may be performed in advance so that superior reliability may be achieved during the operation of the process tool 150 on the basis of the chemical products supplied by the mobile dispense devices 100A, 100B. In this way, any idle times of chemical products supplied to a specific process tool may be significantly reduced, since, in principle, a respective process tool, such as the tool 150, may be provided with a corresponding required chemical product on time and on demand, for instance immediately prior to a change of process recipe, while non-used chemical products may be removed by simply disconnecting their respective mobile dispense devices 100, which may then be used in a different process tool. At any non-used phases, the mobile devices 100 may undergo maintenance and the like, without causing any downtime of a respective process tool. As previously discussed, in conventional manufacturing environments, typically a plurality of different chemical products may be concurrently installed in a respective process tool so as to cover a required number of process recipes that may have to be implemented in a respective process tool, thereby requiring permanent dummy dispense of any non-used chemical products, which may significantly contribute to overall cost of ownership in the manufacturing environment. Moreover, regular or non-planned maintenance activities may contribute to tool downtime, thereby also contributing to increased investment costs and costs of ownership.

Figure 1B:
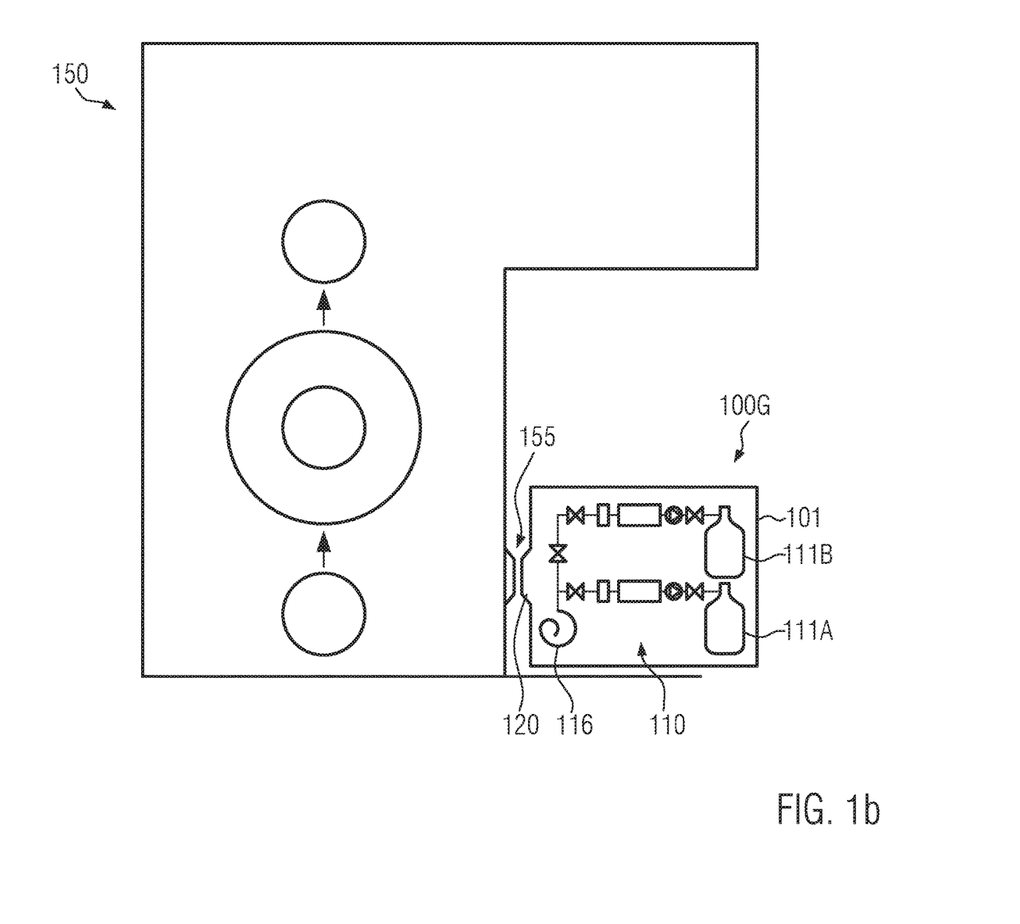
FIG. 1b schematically illustrates the process tool according to a further illustrative embodiment, wherein a mobile dispense device for two or more respective chemical products may be coupled to the process tool.

FIG. 1b schematically illustrates the process tool 150 in combination with a mobile dispense device 100G coupled to the coupling portion 155 by means of the coupling unit 120. The mobile dispense device 100G may be configured so as to supply two or more specific chemical products, which may be advantageous when chemical products are considered that represent a frequently used combination. To this end, the dispense unit 110 may comprise any hardware components required for supplying two or more chemical products. In the example shown in FIG. 1b, two different chemical products may be handled by the dispense unit 110, as indicated by two different storage containers 111A, 111B. Although basically two individual mobile dispense devices 100 may be connected to the tool 150, as for instance illustrated in FIG. 1a, the combination of two or more specific chemical products in a single mobile device 100 may result in superior efficiency, for instance due to the possibility of sharing certain components, such as the coupling unit 120, the dispense nozzle 116, the housing 101 and the like, thereby possibly overcompensating, at least for some combinations of chemical products, the loss of flexibility compared to the provision of two individual mobile dispense devices. For compatibility reasons, the housing 101 may be selected so as to correspond to the housing 101 of the mobile devices 100A, 100B as shown in FIG. 1a, while, in other cases, the housing 101 may have a size corresponding to two housings of the devices as shown in FIG. 1a. With respect to other characteristics and the operational behavior, the same criteria may apply for the device 100G as already discussed above with reference to the mobile devices 100A, 100.

Figure 2A:
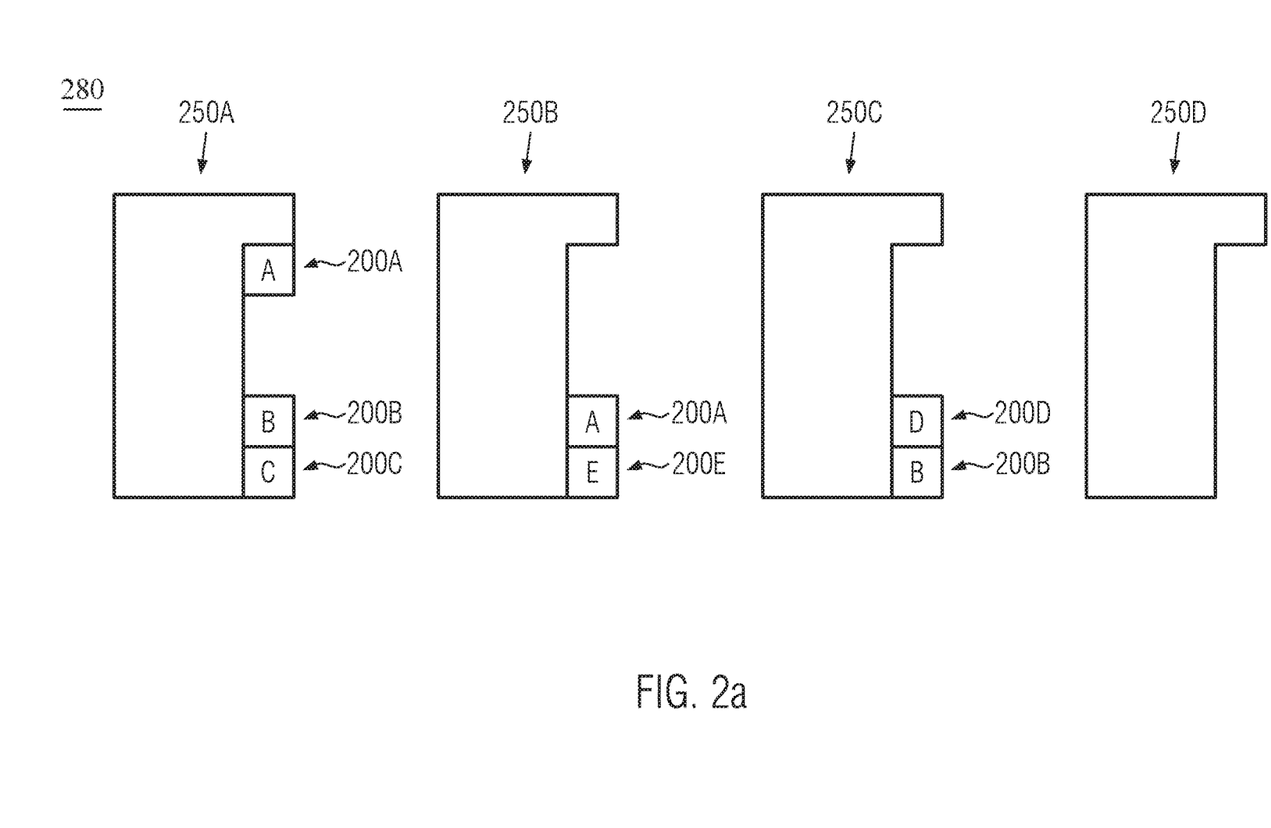
FIG. 2a schematically illustrates a manufacturing environment for micro-processing products, wherein a plurality of process tools may have coupled thereto one or more mobile dispense devices according to illustrative embodiments.

FIG. 2a schematically illustrates a manufacturing environment 280, or at least a portion thereof, in which a plurality of process tools 250A-250D may be installed and may represent process tools that require the operation on the basis of specific chemical products, as for instance discussed with reference to FIGS. 1a and 1b. For example, in some illustrative embodiments, the process tools 250A-250D may represent process tools or wafer tracks that are operated in association with respective process tools, such as lithography tools, in order to form a respective cluster tool, as already discussed above. For convenience, the respective functionally associated process tools, such as the lithography tools, are not illustrated in FIG. 2a. Moreover, it may be assumed that the manufacturing environment 280 may be operated, at least for a specific time horizon, on the basis of five chemical products, indicated by A, B, C, D, E. Consequently, five types of mobile dispense devices 200A, 200B, 200C, 200D, 200E may be available in the manufacturing environment 280 in order to be coupled to the respective process tools on demand. For instance, the process tool 250A may be operated on the basis of the chemical products B, C, which may be provided by the respective mobile dispense devices of the type 200B, 200C. Moreover, it may be assumed that intermittently the chemical product A may be required and therefore a respective mobile dispense device of the type 200A may be connected to the process tool 250A, wherein the device 200A may represent an idle chemical product in times when the chemical product A is not required for the processing of substrates in the tool 250A. Similarly, the process tool 250B may have to be operated, within the specific time horizon, on the basis of the products A, E and therefore a mobile dispense device of the type 200A and a mobile dispense device of the type 200E may be connected to the tool 250B. Likewise, the process tool 250C may be operated on the basis of the chemical products D, B and therefore the mobile dispense devices of the types 200D, 200B may be connected to the tool 250C. Furthermore, the device 250D may not be in use and therefore no mobile dispense device may be connected to this tool. It should be appreciated that any of the mobile dispense devices of the types 200A-200E may have a configuration as previously discussed with reference to the mobile devices 100A, 100B in FIG. 1a. It should also be appreciated that one or more of the mobile devices 200A-200E may have a configuration as described with reference to FIG. 1b, when a combination of chemical products is considered appropriate for operating one or more of the process tools 250A-250D.

Upon operating the manufacturing environment 280 according to a situation as illustrated in FIG. 2a, it is evident that two mobile devices of the type 200A, two mobile devices of the type 200B and one mobile device of the types 200C, 200D, 200E, respectively, are concurrently in operation. That is, for each of the chemical products A, B, two respective "chemical lines" have to be maintained and operated in the environment 280 under the specific process conditions illustrated in FIG. 2a, while, for each of the remaining chemical products C, D and E, one mobile dispense device of the respective type is required, thereby covering the respective process recipes based on five different chemical products.

If, for instance, the same process scheme as illustrated in FIG. 2a is to be applied in a conventional manufacturing environment, this would mean that typically any of the process tools 250A-250D may have installed the five types of chemical products and the respective hardware components, thereby resulting in a significant overall idle time of respective chemical lines and additional hardware components. In this example, this would mean five idle chemical lines in the process tool 250D, three idle chemical lines in the process tool 250C, three idle chemical lines in the process tool 250B and two or three idle chemical lines in the process tool 250A. Consequently, when comparing the situation as shown in FIG. 2a by using the mobile dispense devices according to the present disclosure, only one idle chemical line, i.e., the mobile device 200A connected to the process tool 250A, may contribute to a certain amount of material waste. Therefore, a significant reduction of waste and thus of cost of ownership may be achieved compared to 13 idle chemical lines in a corresponding conventional situation. Also, overall maintenance cost may be reduced and tool availability may be enhanced, as will be discussed later on.

Furthermore, it should be appreciated that the manufacturing environment 280 as shown in FIG. 2a may readily respond to a change in the overall workflow by reconfiguring the respective process tools in that the corresponding types of mobile dispense devices may be connected or disconnected so as to comply with the new workflow. Since typically such changes in overall workflow are determined by a supervising control system of the environment 280, the response time with respect to reconfiguring the manufacturing environment 280 may be relatively short, in particular, when the change of workflow is in accordance with a scheduled overall workflow. In this case, any requirements for additional mobile devices and the transport and connection and disconnection of active mobile devices may be appropriately scheduled in advance so as to avoid or minimize any non-use times in the process tools 250A-250D.

Figure 2B:
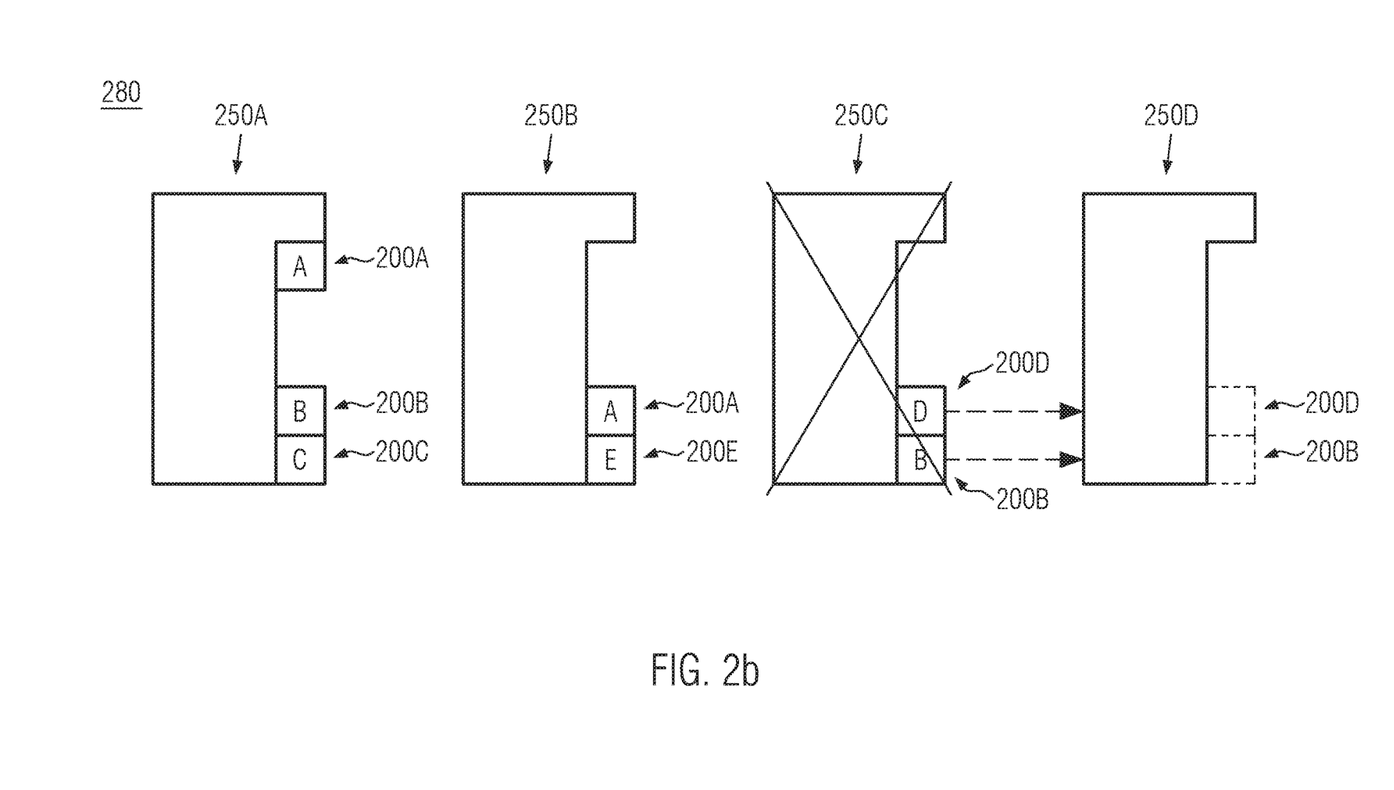
FIG. 2b schematically illustrates the manufacturing environment in a process phase, in which a device failure or a scheduled maintenance in one of the process tools may occur, wherein the modular nature of the mobile dispense unit may allow the transfer of one or more of the mobile dispense devices to a different process tool.

FIG. 2b schematically illustrates the manufacturing environment 280 in a situation in which one of the previously used process tools may no longer be usable, for instance due to a planned maintenance or to any unplanned downtime of the device, for instance due to the detection of a tool failure in the process tool and/or in a correspondingly functionally associated tool, such as a lithography tool. For example, the process tool 250C may be expected to be not operable in a subsequent phase of the overall workflow or the process tool 250C may be detected as having a tool failure so that further processing of substrates may not be possible in the near future, as indicated in FIG. 2b by a X-symbol. If the downtime is strictly related to the process tool or any functionally associated lithography tool, the respective mobile dispense devices, in this case, of the types 200D, 200B, may still be operable and may, therefore, be disconnected and connected to another equivalent process tool in order to resume processing substrates in accordance with process recipes as performed by the process tool 250C. In the example, it may be assumed that the process tool 250D and any functionally associated lithography tool may be equivalent in the sense that this tool may be able to perform the same process recipes as at least the process tool 250C. In this case, the mobile dispense devices 200D, 200B may be disconnected from the tool 250C, be transported to the tool 250D and reconnected, thereby minimizing any idle times of chemical products and also reducing any delays in processing respective substrates. It should be appreciated that, in conventional process regimes with a plurality of permanently installed chemical lines, all of the chemical lines installed in the process tool 250C would remain in an idle state due to the non-usability of the process tool 250C.

Figure 2C:
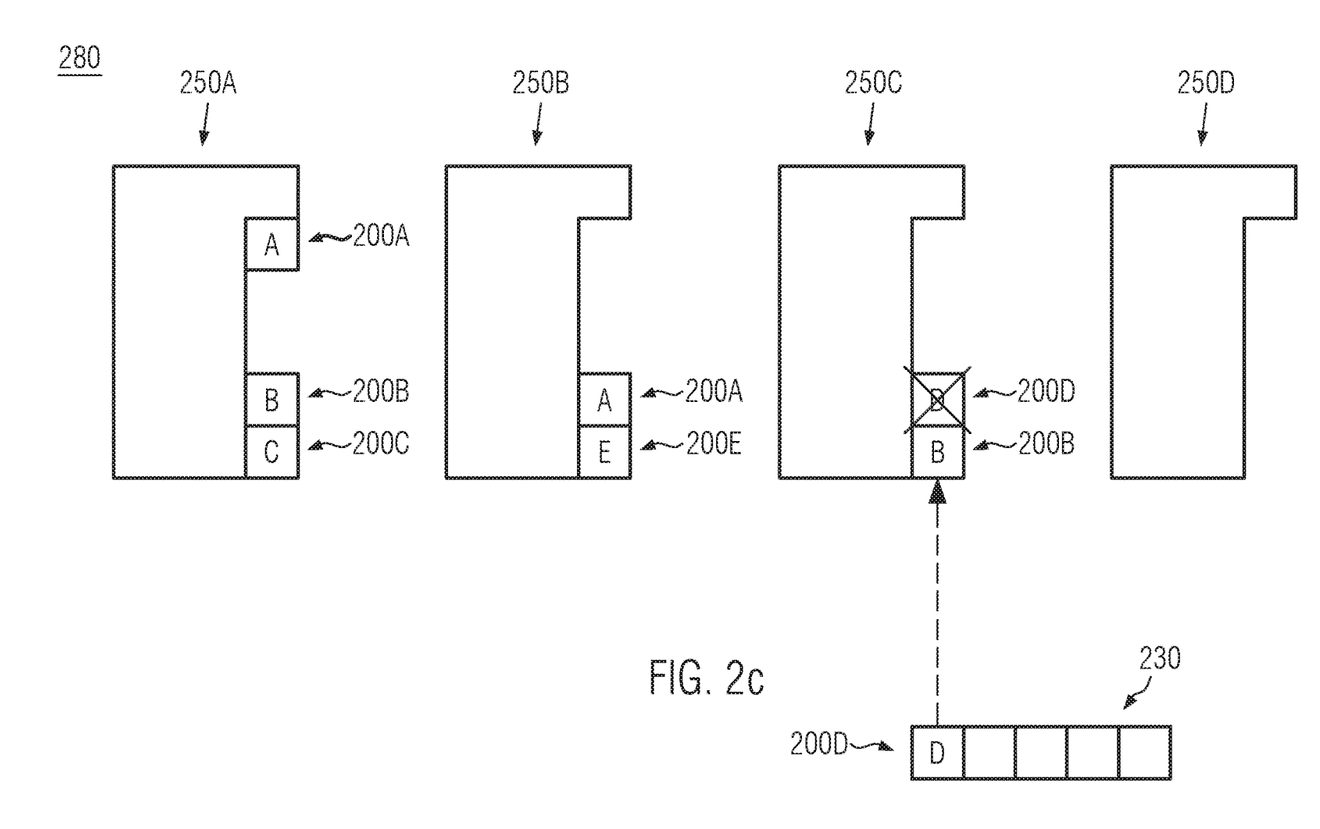
FIG. 2c schematically illustrates the manufacturing environment according to further illustrative embodiments, in which a failure or a scheduled maintenance of a mobile dispense device may be addressed by replacing it with a functional device without requiring a significant downtime of the associated process tool.

FIG. 2c schematically illustrates the manufacturing environment 280 in accordance with yet another process regime, in which, for instance, a planned or non-scheduled downtime of one or more of the mobile dispense devices 200 may occur. In the situation illustrated in FIG. 2c, it may be assumed that a non-expected device failure may be detected, for instance, in one of the mobile dispense devices connected to the process tool 250C, thereby temporarily causing the process tool 250C to transmit into a non-usable state. For example, a corresponding device failure may be detected by a device internal control unit of the mobile device 200D or by the supervising control system of the environment or by the controller of the tool 250C on the basis of respective sensors, status of components and the like. For instance, a non-expected failure in one of the hardware components, a failure of incorrectly metering the respective chemical product and the like may be detected. A corresponding device failure may, therefore, be reported to a supervising control system of the environment 280. In this case, a corresponding functional mobile dispense device 200D may be selected in a store of mobile devices 230 that is associated with the manufacturing environment 280. In other cases, a corresponding type of mobile dispense device may be prepared on demand, if the store 230 may currently not include a mobile dispense device of the required type. Consequently, the defective mobile device 200D may be replaced by a functional mobile dispense device of the same type. In this manner, the entire downtime of the process tool 250C may be reduced compared to conventional process regimes, in which the failure of a permanently installed chemical line, which may currently be in use, may result in the downtime of the process tool 250C and the associated lithography tool until the problems in the defective chemical line are resolved.

As discussed above, due to the mobile or modular character of respective chemical lines provided by the mobile dispense devices, significant advantages may be achieved compared to conventional process regimes in which typically a plurality of chemical products is installed in a plurality of process tools in the same combination. For example, when considering the supply of a chemical product, such as a photoresist, which may correspond to a process recipe that is not often used in the manufacturing environment, for instance when the specific process recipe and thus the corresponding chemical products are connected to only one process tool, a non-expected down time or a scheduled downtime of the process tool may not significantly affect the overall availability of the specific process recipe in the manufacturing environment, since the required chemical products may be efficiently disconnected from the non-functional process tool and reconnected to any available process tool in the manufacturing environment, as also discussed above.

Furthermore, due to the complexity of products and processes, frequently various combinations of chemical products, such as resist/bottom anti-reflective coating/top anti-reflective coating, may have to be tested and thus one or more of these chemical products may be supplied by means of the mobile dispense device to a process tool, in which the remaining chemical products are already connected. Consequently, a new combination of chemical products may be efficiently implemented and tested without being constrained to previously permanently installed chemical lines, as is the case in conventional process regimes.

As discussed above with reference to FIGS. 2a-2c, a sequential use of at least some of specific types of chemical products may be accomplished, since a corresponding mobile dispense device may be readily disconnected from a process tool and reconnected at a different process tool in accordance with overall process requirements, thereby reducing the number of chemical lines to be used in parallel in the environment contrary to the situation in conventional process regimes. In this manner, the average elapsed shelf life of the used chemical products may be reduced compared to the conventional regime.

In other cases, some of the process tools may be used with high throughput on the basis of a specific combination of chemical products, for instance on the basis of a specific photoresist. Such a situation may typically be encountered when processing semiconductor devices which may require a profiling of doped regions, wherein typically a resist mask is used as an implantation mask for controlling the incorporation of dopant species during the various implantation processes. Since the corresponding incorporation of dopant species may be required for a plurality of different product types and at several stages of the manufacturing flow of the same product type, a high throughput in these process steps is important with respect to overall productivity in the manufacturing environment. When such a high throughput tool may encounter an issue with one of the required chemical products, for instance with the photoresist, in conventional process regimes, the whole process tool or cluster tool would be in a non-usable state, as, for instance, explained above with reference to FIG. 2c. On the other hand, according to the concepts disclosed herein, by simply replacing the defective mobile dispense device by a functional device, the downtime of the entire process tool may be reduced.

Moreover, as discussed above, in illustrative embodiments, the mobile dispense devices may be fully operational without being connected to a specific process tool and thus qualification tests with respect to the quality of the chemical products, maintenance of other components and the like may be efficiently performed off-line, thereby substantially not affecting availability of the process tools, in particular of high throughput process tools.

Generally, the effort for maintaining a required number of chemical products for a given number of process tools may be significantly reduced compared to the conventional regime. For example, a typical high-volume semiconductor facility may have approximately 50 process tools or more of equivalent type, wherein each tool may have installed therein on average 6 chemical lines. Therefore, in total, 300 chemical lines or more may have to be maintained in a conventionally organized manufacturing environment. On the other hand, according to the technical concepts disclosed herein, a reduction of up to 20-40% or more of chemical lines to be maintained may be achieved substantially without negatively affecting the overall tool availability and flexibility of the workflow in the manufacturing environment, while, in other cases, tool availability and/or process flexibility may be enhanced. In addition to generally reducing the number of chemical products that may concurrently be used in the manufacturing environment, in particular the overall waste of chemical products, caused by non-productive phases, such as dummy dispense, testing, set up and maintenance, may contribute to significant savings. Furthermore, the costs for consumables, such as filters, pumps, valves and the like, may also be reduced due to the reduced number of chemical products that have to be concurrently provided in the manufacturing environment. At the same time, as discussed above, tool availability may be improved by decoupling issues related to the chemical products from issues related to the hardware of the process tools.

For example, in a simplified conventional manufacturing regime, 6 chemical products may be installed across 10 process tools, for instance with respect to 3 different resists, 2 different bottom anti-reflective coatings and one type of top coating/top anti-reflective coating. Therefore, 60 chemical lines conventionally have permanently been maintained at any time, if assuming that all 10 process tools are concurrently in use. Consequently, at any time, a maximum number of chemical product lines in use may be 30 chemical products so that the remaining 30 chemical products may be idle, thereby contributing to increased overall waste and increased effort with respect to maintenance and also contributing to increased overall downtime of the process tools, as discussed above.

In comparison to this situation, the present disclosure may enable the implementation of a process regime in which 40 chemical product lines may suffice so as to cover the total range of required process recipes, for instance by implementing 10 top coating devices+5 bottom anti-reflective coatings of a first type+5 bottom anti-reflective coatings of a second type+20 resist lines. Consequently, the number of chemical product lines may be reduced from 60 in the conventional regime to 40 according to the regime of the present disclosure.

Thus, a corresponding amount of consumables and hardware components may be saved, such as 20 filter units, 20 pumps, many valves, buffer tanks, storage containers for resists and solvents, and the like. When assuming that 1 cc per line per hour has to be applied for a dummy dispense so as to keep a respective chemical product line operational, this would result, for 20 additional chemical product lines, in about 175 liters per year. Furthermore, chemical purging is typically required upon changing a filter or upon performing maintenance or resolving any device issues and the like. Typically, at least one bottle per year per chemical product is a realistic estimation, thereby resulting in 20 bottles per year yielding approximately 800 liters per year. Furthermore, 20 less bottles of chemical products need to be stored in the manufacturing environment, thereby also contributing to superior process efficiency.

With respect to tool down time, it may be assumed that typically 0.5 hours per week per chemical product may represent a realistic estimation for tool downtime caused by issues with a respective chemical product. In total, for 20 additional chemical product lines required in the conventional example, a total downtime of process tools may yield 21 days per year. Consequently, a significant contribution to superior tool availability and reduced cost of ownership may be achieved in this example, wherein nearly 20 chemical product lines may be saved compared to the conventional regime.

As a result, the present disclosure provides techniques in which the overall efficiency in terms of tool availability, process flexibility and cost of ownership may be enhanced in a complex manufacturing environment by providing chemical products on the basis of dedicated mobile dispense devices. In this manner, a reduced number of chemical product lines have to be maintained in the manufacturing environment, thereby, for instance, reducing also the investment required for building up a respective manufacturing environment. Furthermore, in total, the line maintenance costs may be reduced due to the reduced number of concurrently used chemical product lines. Furthermore, the total tool downtime may be reduced, since maintenance of chemical product related issues may be resolved off-line, while, on the other hand, maintenance of process tools may be performed while using respective chemical products in other operational process tools. Contrary to conventional approaches, the overall flexibility in using a process tool may no longer be limited by the number of chemical processes and thus products, i.e., process recipes, that may concurrently be implemented in a process tool. That is, many different types of process recipes requiring specific combinations of chemical products may be qualified for the same process tool by efficiently connecting the required chemical products to a process tool on the basis of the mobile dispense devices. Also, a reduced overall length of the supply pipeline may be achieved on the basis of the mobile dispense devices, thereby reducing the probability of chemical contamination, reducing waste of chemicals upon purging the respective supply lines and the like. Furthermore, the flexibility for qualifying new process recipes on the basis of new chemical products as, for instance, frequently required in research and development strategies, may be accomplished more efficiently due to the modular nature of the respective chemical products. On the other hand, only a reduced number of storage containers for the respective chemical products need to be stored and maintained within the manufacturing environment compared to the conventional strategy.

In some illustrative embodiments, appropriate coupling portions may be retrofitted to existing process tools, thereby imparting to these process tools the ability to connect to mobile dispense devices. In other cases, the respective hardware components for providing appropriate coupling portions and components of handling portions, for instance for positioning dispense nozzles and the like, as discussed above, may be efficiently implemented in any new generation of process tools, wherein, in some embodiments, these coupling portions may represent the only source for being supplied with process recipe related process fluids. Due to the lack of any stationary fluid dispense systems of such process tools, also reduction of hardware complexity in these process tools may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of operating a process tool for microprocessing substrates in a manufacturing environment, said method comprising:
    determining a specific type of chemical product to be applied to said substrates when processing said substrates in said process tool;
    selecting, from a plurality of mobile dispense devices, each being configured to provide one of a plurality of specific chemical products, one mobile dispense device configured to provide said specific type of chemical product;
    coupling said selected mobile dispense device to said process tool;
    performing at least one process recipe on said substrates using said specific type of chemical product; and
    removing said mobile dispense device from said process tool after having processed all substrates requiring said specific type of chemical product and coupling said mobile dispense device to another process tool that requires application of said specific type of chemical product to one or more further substrates.

2. The method of claim 1, further comprising, upon detecting at least one of a failure related to said specific type of chemical product and a requirement for maintenance of said process tool, replacing said mobile dispense device with a different mobile dispense device that is configured to provide said specific type of chemical product, and continuing processing said substrates.

3. The method of claim 1, wherein said process tool is functionally associated with a lithography tool so as to form a cluster tool.

4. The method of claim 3, wherein a storage container of at least some of said plurality of mobile dispense devices is configured to contain as said chemical product one specific process fluid required to be applied to said substrates at least one of prior to and after performing an exposure process in said lithography tool.

5. The method of claim 1, wherein each of said mobile dispense devices are configured to provide a single chemical product.

6. The method of claim 1, wherein said mobile dispense devices are configured to provide two or more different chemical products.

7. The method of claim 1, wherein a dispense unit of each of said mobile dispense devices comprises at least one of a pump unit, a filter unit, a valve unit and a dispense nozzle.

8. The method of claim 1, further comprising positioning a dispense nozzle of a coupled one of said mobile dispense devices above one of said substrates at a dispense location for dispensing said chemical product.

9. The method of claim 1, further comprising exchanging process related information between the process tool and the plurality of mobile dispense devices in a manufacturing environment accommodating said process tool and said plurality of mobile dispense devices.

10. A method of operating a process tool for microprocessing substrates in a manufacturing environment, said method comprising:
    determining a specific type of chemical product to be applied to said substrates when processing said substrates in said process tool;
    selecting, from a plurality of mobile dispense devices, each being configured to provide one of a plurality of specific chemical products, one mobile dispense device configured to provide said specific type of chemical product;
    coupling said selected mobile dispense device to said process tool;
    performing at least one process recipe on said substrates using said specific type of chemical product;
    removing said mobile dispense device from said process tool upon detecting a tool failure of said process tool; and
    coupling said mobile dispense device to a different process tool that is functionally equivalent to said process tool and continuing processing remaining substrates in said different process tool.

11. The method of claim 10, wherein said process tool is functionally associated with a lithography tool so as to form a cluster tool.

12. The method of claim 11, wherein a storage container of at least some of said plurality of mobile dispense devices is configured to contain as said chemical product one specific process fluid required to be applied to said substrates at least one of prior to and after performing an exposure process in said lithography tool.

13. The method of claim 10, wherein each of said mobile dispense devices are configured to provide a single chemical product.

14. The method of claim 10, wherein said mobile dispense devices are configured to provide two or more different chemical products.

15. The method of claim 10, wherein a dispense unit of each of said mobile dispense devices comprises at least one of a pump unit, a filter unit, a valve unit, and a dispense nozzle.

16. The method of claim 10, further comprising positioning a dispense nozzle of a coupled one of said mobile dispense devices above one of said substrates at a dispense location for dispensing said chemical product.

17. The method of claim 10, further comprising exchanging process related information between the process tool and the plurality of mobile dispense devices in a manufacturing environment accommodating said process tool and said plurality of mobile dispense devices.

\* \* \* \* \*